United States Patent [19]

Frisina et al.

[11] Patent Number: 5,592,026

[45] Date of Patent: Jan. 7, 1997

[54] INTEGRATED STRUCTURE PAD ASSEMBLY FOR LEAD BONDING

[75] Inventors: Ferruccio Frisina, S. Agata Li Battiati; Marcantonio Mangiagli, Acireale, both of Italy

[73] Assignee: Consorzio per la Ricerca Sulla Microelettronica nel Mezzogiorno, Catania, Italy

[21] Appl. No.: 361,801

[22] Filed: Dec. 21, 1994

[30] Foreign Application Priority Data

Dec. 24, 1993 [EP] European Pat. Off. .............. 93830524

[51] Int. Cl.⁶ ............................ H01L 29/41; H01L 29/78
[52] U.S. Cl. .......................... 257/786; 257/341; 257/784; 257/785
[58] Field of Search ...................... 257/786, 785, 257/341, 784

[56] References Cited

U.S. PATENT DOCUMENTS

| | | | |
|---|---|---|---|
| 3,434,019 | 3/1969 | Carley | 317/235 |
| 3,667,008 | 5/1972 | Katnack | 317/235 |
| 3,831,067 | 8/1974 | Wislocky et al. | 317/234 |
| 4,008,486 | 2/1977 | Byczkowski | 357/74 |
| 4,015,278 | 3/1977 | Fukuta | 357/22 |
| 4,055,884 | 11/1977 | Jambotkar | 29/571 |
| 4,070,690 | 1/1978 | Wickstrom | 357/68 |
| 4,145,700 | 3/1979 | Jambotkar | 357/23 |
| 4,236,171 | 11/1980 | Shen | 357/68 |
| 4,305,087 | 12/1981 | Wislocky | 357/79 |
| 4,329,642 | 5/1982 | Luthi et al. | 324/158 |
| 4,376,286 | 3/1983 | Lidow et al. | 357/23 |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,556,896 | 12/1985 | Meddles | 357/70 |
| 4,574,208 | 3/1986 | Lade et al. | 257/365 |
| 4,593,302 | 6/1986 | Lidow et al. | 357/23.4 |
| 4,638,553 | 1/1987 | Nilarp | 29/580 |
| 4,639,762 | 1/1987 | Neilson et al. | 257/341 |
| 4,641,418 | 2/1987 | Meddles | 29/588 |
| 4,642,419 | 2/1987 | Meddles | 174/52 |
| 4,651,181 | 3/1987 | David | 257/341 |
| 4,663,820 | 5/1987 | Ionescn | 29/590 |
| 4,680,853 | 7/1987 | Lidow et al. | 29/571 |
| 4,789,882 | 12/1988 | Lidow | 357/23.4 |
| 4,794,431 | 12/1988 | Park | 357/19 |
| 4,845,545 | 7/1989 | Abramowitz et al. | 357/74 |
| 4,853,762 | 8/1989 | Ewer et al. | 357/79 |
| 4,878,099 | 10/1989 | Nilarp | 357/71 |
| 4,881,106 | 11/1989 | Barron | 357/23.8 |
| 4,890,142 | 12/1989 | Tonnel et al. | 257/343 |
| 4,965,173 | 10/1990 | Gould | 430/317 |
| 5,016,066 | 5/1991 | Takahashi | 257/341 |
| 5,047,833 | 9/1991 | Gould | 357/71 |
| 5,130,767 | 7/1992 | Lidow et al. | 357/23.4 |
| 5,153,507 | 10/1992 | Fong et al. | 257/786 |
| 5,250,821 | 10/1993 | Ferla et al. | 257/723 |
| 5,365,112 | 11/1994 | Ohshima | 257/786 |

FOREIGN PATENT DOCUMENTS

| | | | |
|---|---|---|---|
| 1136291 | 11/1982 | Canada | H01L 29/94 |
| 0421344 | 4/1991 | European Pat. Off. | H01L 23/48 |
| 0433650 | 6/1991 | European Pat. Off. | H01L 23/48 |
| 0450320 | 10/1991 | European Pat. Off. | H01L 21/60 |
| 1224335 | 3/1971 | United Kingdom | H01L 11/14 |
| 2087648 | 5/1982 | United Kingdom | H01L 23/00 |

OTHER PUBLICATIONS

Patent Abstracts of Japan, vol. 17, No. 570 (E–1448) Oct. 1993 & JP–A–05167070 (NEC Kansai Ltd).

Primary Examiner—Jerome Jackson, Jr.
Attorney, Agent, or Firm—David M. Driscoll; James H. Morris; John N. Anastasi

[57] ABSTRACT

An integrated structure pad assembly for wire bonding to a power semiconductor device chip including a chip portion having a top surface covered by a metallization layer which has a first sub-portion wherein functionally active elements of the power device are present. The chip portion has at least one second sub-portion wherein no functionally active elements of the power device are present. The top surface of the at least one second sub-portion is elevated with respect to the first sub-portion to form at least one protrusion which forms a support surface for a wire.

29 Claims, 3 Drawing Sheets

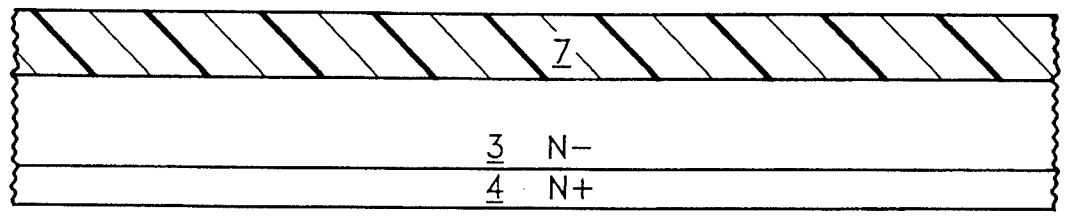
Fig.5
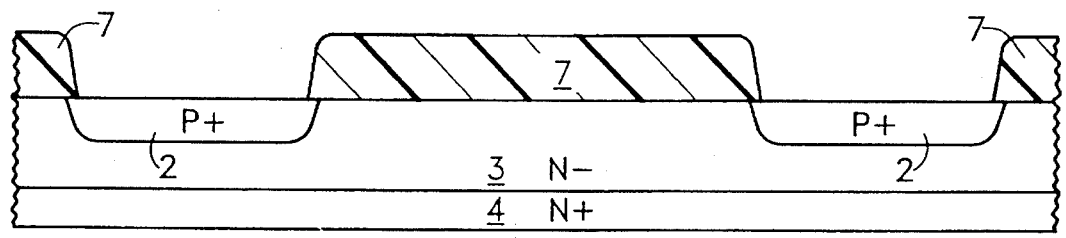
Fig.6
Fig.7
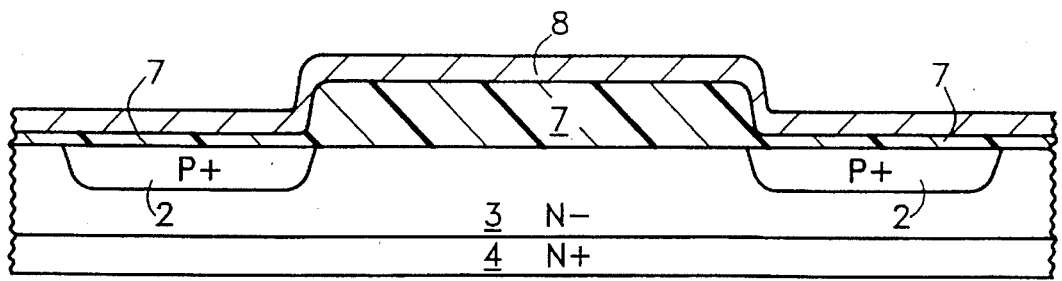

INTEGRATED STRUCTURE PAD ASSEMBLY FOR LEAD BONDING

BACKGROUND OF THE INVENTION

1. Field of the Invention

The present invention discloses an integrated structure pad assembly for wire bonding on active area in power semiconductor devices, particularly those with cellular structures such as power MOSFETs and Insulated Gate Bipolar Transistors, and to a manufacturing process therefor.

2. Discussion of the Related Art

In power semiconductor devices such as those fabricated in MOS technology the chip area reserved to the bonding pads can be a significant fraction of the overall chip area. In the case for example of a low-voltage power MOSFET with a specified voltage rating of 100 V, the MOSFET current can be in the range of several tens of Amperes. To sustain such a current, the source wire must have a large diameter, typically 0.4–0.5 mm, and the area dedicated to bonding the wire to the chip must be of the order of 1.3×1.3 mm2. The situation is even worse when more than one source wire is necessary.

To overcome this problem, a technique in which the bonding areas are directly over the active area of the device is utilized without the necessity of providing dedicated pad areas. This technique is known as "bonding on active area", and allows a reduction in the chip size, since no areas are wasted for the realization of the bonding pads.

This technique however poses some problems, particularly as far as the soldering process between the wire and the chip metallization layer is concerned. Generally, aluminum wires having large diameters are soldered to the chip metallization layer by a technique known as "Ultrasonic Wire Bonding" (USWB). This technique consists of laying the wire to be soldered on the aluminum layer on the chip, applying a given vertical force to the wire, and simultaneously submitting the wire to an "ultrasonic discharge". The ultrasonic discharge, together with the pressure exerted on the wire, put the two surfaces into close contact, breaking down their superficial oxides so that soldering is obtained.

When Ultrasonic Wire Bonding on active area is carried out, for example on a power MOSFET chip, the significant mechanical stress to which the device is submitted during the bonding phase is transferred to the dielectric layers underlying the metallization layer, i.e. to the gate oxide layer and to the polysilicon gate layer, causing cracks in the oxide layer or microdefects which reduce the device reliability. The gate oxide layer, being generally the thinnest dielectric layer, is the most susceptible to such damage. The larger the diameter of the wires used, the more probable the phenomenon is. When wires of diameter larger than 0.4 mm are used, systematic damage can take place. Furthermore, since the technology trend in low-voltage power MOS devices is toward a reduction in the oxide layer thickness to reduce the output resistance and to increase the current densities, bonding on active area becomes more and more impractical.

SUMMARY OF THE INVENTION

In view of the state of the art as described, the object of the present invention is to create an integrated structure pad assembly for wire bonding which allows bonding on active area without the above mentioned drawbacks.

According to the present invention, this object is attained by means of an integrated structure pad assembly for wire bonding in a power semiconductor device chip. The semiconductor device chip includes a chip portion having a top surface covered by a metallization layer which has a first sub-portion wherein functionally active elements of the power device are present. The chip portion contains at least one second sub-portion wherein no functionally active elements of the power device are present. The top surface of the at least one second sub-portion is elevated with respect to the top surface of the first sub-portion to form at least one protrusion which forms a support surface for a wire.

In a pad assembly having a structure according to the present invention, the mechanical stresses transmitted by the wire to the power device chip during the bonding process are sustained by the second sub-portion which does not contain any functionally active element of the power device.

According to a preferred embodiment of the present invention, the power semiconductor device comprises a plurality of identical functionally active elementary cells disposed in a horizontal bidimensional array. Said first sub-portion comprises at least one of said functionally active elementary cells, and said at least one second sub-portion is represented by a dummy cell having horizontal dimensions substantially identical to the horizontal dimensions of the functionally active elementary cells, said dummy cell having a vertical dimension larger than the vertical dimension of the functionally active elementary cells so that the top surface of the metallization layer is elevated over the dummy cell with respect to the functionally active elementary cells.

In this embodiment of the invention, since the bonding wires do not come into hard physical contact with the elementary functional cells but only with the dummy cells and since these latter are more resistant to mechanical stress than the elementary functional cells, it possible to realize a bonding pad assembly directly on the active area of the power semiconductor device without the risk of damaging the power device.

The features of the present invention will be made more evident by the following detailed description of three practical realization of its preferred embodiment, illustrated as non-limiting examples in the annexed drawings.

BRIEF DESCRIPTION OF THE DRAWINGS

FIGS. 5 to 7 are cross-sectional view similar to that shown in FIG. 2, showing intermediate steps during the manufacturing process.

DETAILED DESCRIPTION

Figure 2:
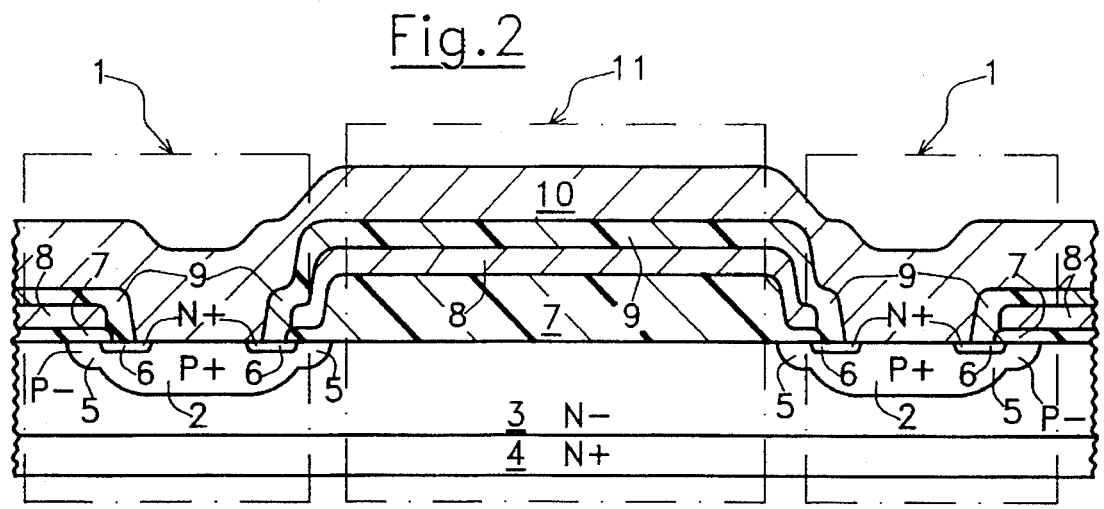
FIG. 2 is a cross-sectional view taken along the line II—II of FIG. 1.

A power semiconductor device, for example a power MOSFET, is composed of a plurality of elementary cells, also called "source cells", disposed to form a bidimensional array. In FIG. 2 two source cells 1 are shown each formed by a respective first sub-portion of semiconductor device chip. They comprise a P+ deep body region 2 within an N- epitaxial layer 3 which is in turn grown over an N+ substrate 4. The P+ deep body region 2 is laterally surrounded by and merged with a P- annular region 5. Inside the P type semiconductor region composed of the P- annular region 5 and by the P+ deep body region 2, an N+ annular region 6 is obtained constituting a source region of the elementary source cell 1. At the semiconductor surface, an oxide layer 7 extends over the P- annular region 5 and partially over the N+ annular region 6. A polysilicon layer 8 is superimposed over and autoaligned with the underlying oxide layer 7. An insulating layer 9 covers the polysilicon layer 8 and is selectively etched to form contact areas to allow an overlying metal layer 10 to come into contact with both the N+ annular region 6 and the P+ deep body region 2. The metal layer 10 contacts in the same way all the elementary source cells 1 and constitutes a source electrode for the power MOSFET.

Figure 1:
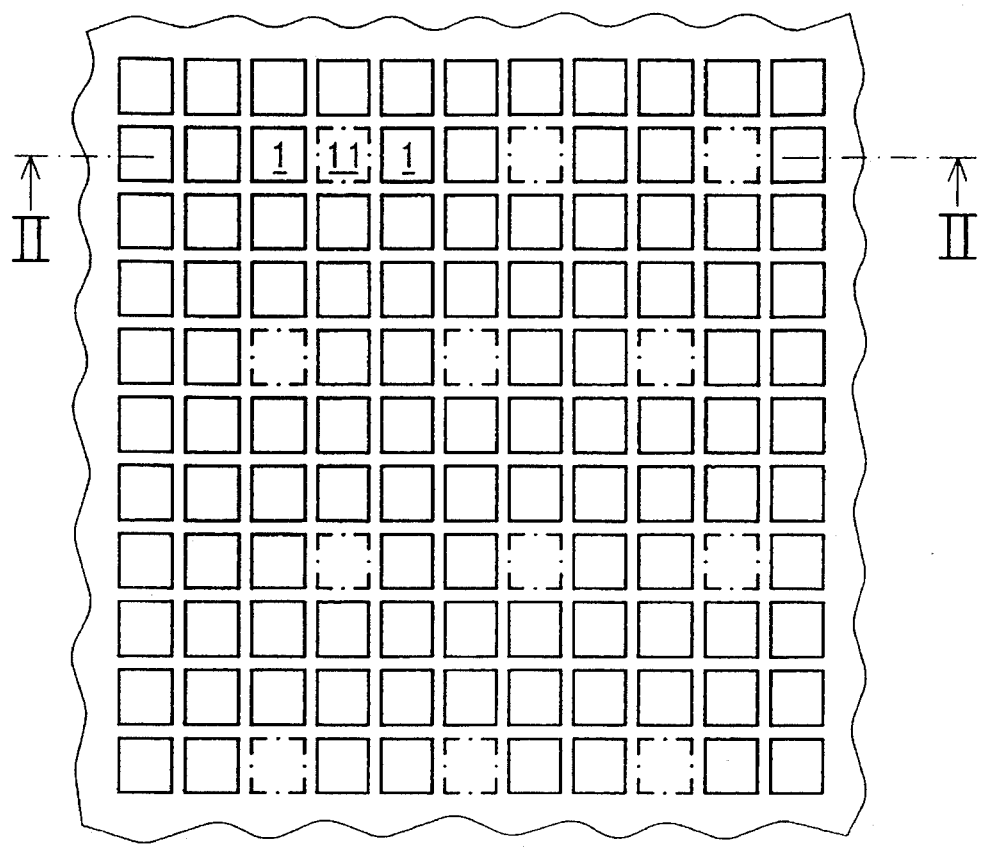
FIG. 1 is a schematic top plan view of an integrated structure pad assembly according to a first practical realization of one embodiment of the invention.

An integrated structure pad assembly according to a first practical realization of a preferred embodiment of the invention, shown in FIG. 1, is substantially constituted of a bidimensional array of elementary source cells 1 intercalated with dummy cells 11 having horizontal dimensions identical to those of the source cells 1 but of different height. This clearly appears in FIG. 2, wherein the cross-section of one of such dummy cell 11 is shown as formed by a second sub-portion of the semiconductor chip. Different from an elementary source cell 1, no P+ deep body region 2, P- annular region 5 or N+ annular region 6 are provided in the dummy cell 11. Furthermore, the thickness of the oxide layer 7 in the dummy cells is greater than the thickness of said oxide layer 7 in the source cells 1. This causes the surface of the metal layer 10 to be elevated over the dummy cells 11 with respect to the source cells 1. The dummy cells 11 are more resistant to mechanical stresses than the source cells because of the greater thickness of the oxide layer 7. Due to the fact that the metal layer of the dummy cells 10 protrudes outwardly with respect to the surface of the source cells, when a wire is laid on the pad for being soldered to it, said wire does not come into hard physical contact with the elementary source cells 1, but only with the dummy cells 11.

Various topological distribution of dummy cells 11 and elementary source cells 1 are possible, depending on the wire diameter. In FIG. 1, a distribution is shown in which about 90% of the pad area is occupied by elementary source cells 1 and 10% by dummy cells 11. This means that 90% of the pad area is active area, and only 10% of the area is wasted.

Figure 3:
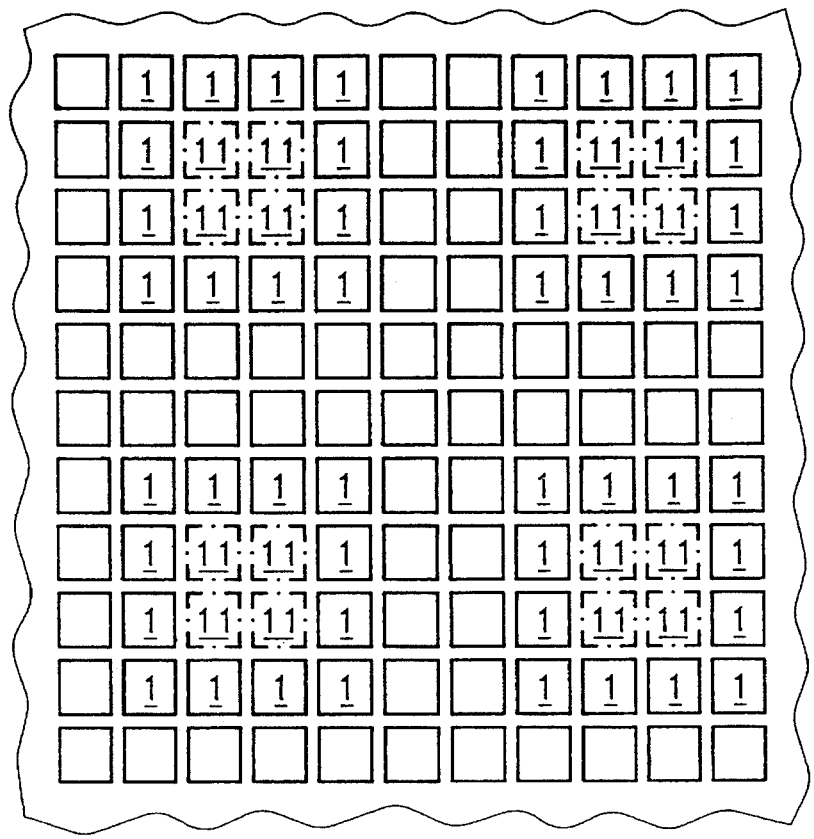
FIG. 3 is a schematic top plan view of an integrated structure pad assembly according to another embodiment of the invention.

In FIG. 3 another embodiment of the invention is shown. This arrangement is substantially different than the previous one in that a different topological distribution of elementary source cells 1 and dummy cells 11 is used. However, as in the previous practical realization, 90% of the total pad area is active area while the 10% is wasted area.

Figure 4:
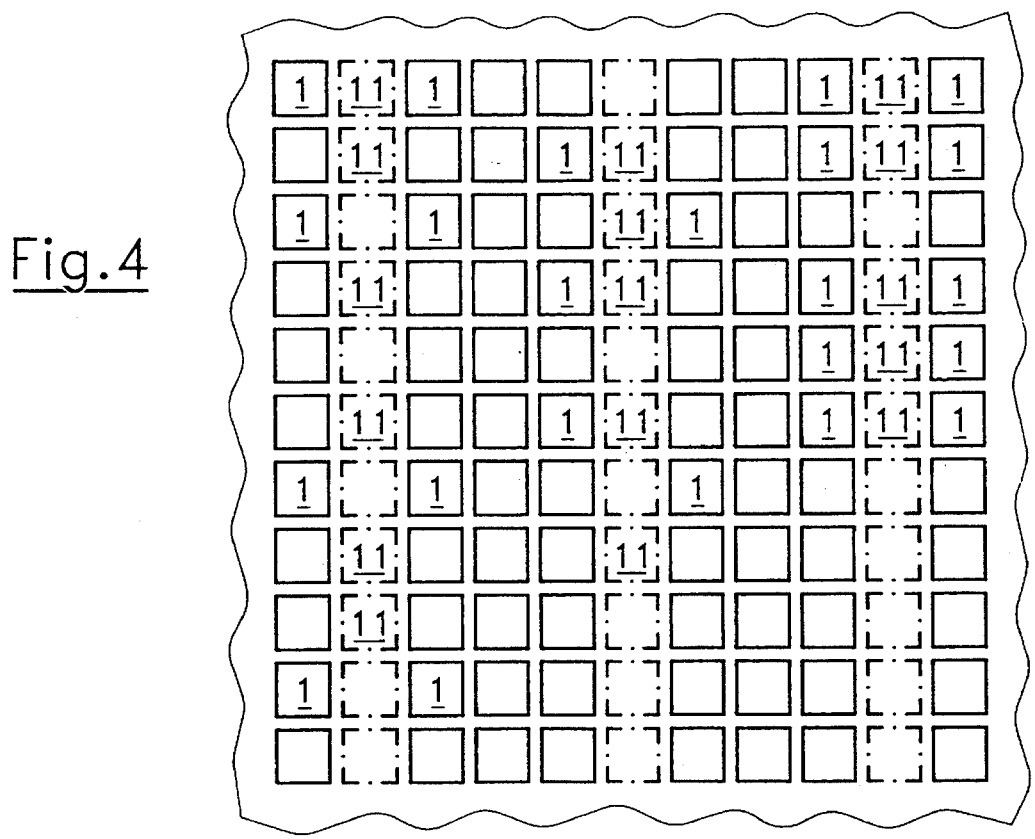
FIG. 4 is a schematic top plan view of an integrated structure pad assembly according to another embodiment of the invention.

In FIG. 4 another embodiment is shown in which the dummy cells 11 are disposed to form lines.

As already noted, different topological dispositions and densities of the dummy cells 11 in the array of elementary cells 1 can be used, depending on the wire diameter and on the total pad area.

For the manufacturing of an integrated structure pad assembly according to the preferred embodiment of the invention, a lightly doped N- epitaxial layer 3 is initially grown over a heavily doped N+ substrate 4. The latter is generally a silicon wafer with the "100" crystallographic cut orientation, and has a resistivity of about 10 mohm/cm. The epitaxial layer is instead highly resistive, having a resistivity value ranging from 1 to 100 ohm/cm. The thickness of the epitaxial layer 3 ranges from 1 to 100 μm.

The silicon wafer is then oxidixed to obtain an oxide layer having thickness of about 1 or 2 μm (FIG. 5). Masking and selective etching allow for windows in the oxide layer in correspondence of the areas of formation of the elementary source cells 1 of the power device. The oxide layer is not removed from the areas wherein dummy cells 11 are to be obtained or in the periphery of the chip.

Boron ions are then implanted into the epitaxial layer 3 through said windows in the oxide layer to form the P+ deep body regions 2 of the elementary cells 1 (FIG. 6). The oxide layer 7 is then removed from the surface of the active area of the power device but not from the areas wherein the dummy cells 11 are to be formed.

The active area of the device is then covered by a thinner oxide layer to form the gate oxide layer, and the whole semiconductor surface is covered by a polysilicon layer 8 (FIG. 7).

Windows are then opened in the polysilicon layer 8 and in the thinner oxide layer to selectively implant dopant ions to form the P- annular regions 5 and the N+ source regions 6 of the elementary cells 1.

An insulation layer 9 (FIG. 2) is then deposited on the semiconductor surface and contact windows are opened in it to allow a metal layer 10 to come into contact with the source regions 6 and with the P+ deep body region 2 of all the elementary cells 1. A metallization layer is also deposited on the bottom surface of the device to form a drain electrode of the power MOSFET.

Having thus described several embodiments of the invention, various alterations, modifications and improvements will readily occur to those skilled in the art. Such alterations, modifications and improvements are intended to be part of this disclosure and are intended to be within the spirit and scope of the invention. Accordingly, the foregoing description is by way of example only and not intended as limiting. The invention is limited only as defined in the following claims and equivalents thereto.

What is claimed is:

1. An integrated pad assembly disposed substantially within an active element of a semiconductor device, for bonding to an electrode of the active element of the semiconductor device, comprising a semiconductor substrate having a first sub-portion containing the active element of the semiconductor device, said first sub-portion being located in an upper portion of the substrate, and a second sub-portion wherein no active element of the semiconductor device is present, each of said first sub-portion and said second sub-portion being completely covered by a continuous metallization layer, and at least one layer of a dielectric material being partially disposed between a top surface of said second sub-portion and said metallization layer so that said continuous metallization layer disposed above the second sub-portion is connected to at least a portion of said electrode of said active element of said first sub-portion.

2. The integrated pad assembly according to claim 1 wherein said metallization layer disposed above said second sub-portion is higher than said metallization layer disposed above said first sub-portion.

3. An integrated structure pad assembly for wire bonding to a power semiconductor chip, comprising: a plurality of device chip portions disposed in a bidimensional array, each of said plurality of device chip portions having a top surface completely covered by a metallization layer, at least one first sub-portion wherein functionally active elements of the power device are present and at least one second sub-portion wherein no functionally active elements of the power device are present, wherein said top surface of the metallization layer of said at least one second sub-portion is elevated with respect to said top surface of the metallization layer of said first sub-portion to form the integrated pad assembly which forms a support surface for a wire, and wherein said second sub-portions have horizontal dimensions substantially identical to the horizontal dimensions of said first sub-portions.

4. An integrated structure pad assembly according to claim 3, comprising a plurality of said second sub-portions which are intercalated with said first sub-portions.

5. An integrated structure pad assembly according to claim 4 wherein said second sub-portions are located in a square array and surrounded by said first sub-portions.

6. An integrated structure pad assembly according to claim 5 wherein said square array is a 2 by 2 array.

7. An integrated structure pad assembly according to claim 4 wherein said second sub-portions are located in one dimensional arrays and surrounded by said first sub-portions.

8. An integrated structure pad assembly according to claim 3, said semiconductor device chip comprising a substrate which is located under both said first sub-portions and said second sub-portions and which is entirely covered by a lightly doped layer of a first conductivity type, wherein each one of said first sub-portions is constituted of a respective first portion of the said lightly doped layer in which a heavily doped region of a second conductivity type is disposed and in which at least one heavily doped region of the first conductivity type is further disposed, at least a part of said heavily doped region of the second conductivity type being covered by a triple layer comprising a first insulating layer, a conductive layer and a second insulating layer, wherein each one of said second sub-portions is constituted of a respective second portion of the lightly doped layer which is completely covered by said triple layer wherein the first insulating layer disposed above the second sub-portions is thicker than the respective first insulating layer disposed above said first sub-portions.

9. The integrated structure pad assembly according to claim 8, wherein that said lightly doped layer of the first conductivity type is an epitaxial layer.

10. The integrated structure pad assembly according to claim 9 wherein said substrate is of the first conductivity type.

11. The integrated structure pad assembly according to claim 9, wherein said substrate is of the second conductivity type.

12. An integrated pad assembly disposed substantially within an active region of a semiconductor device, for lead bonding to an electrode of the active region of the semiconductor device, comprising a heavily doped semiconductor material of a first conductivity type being completely covered by a lightly doped layer of said first conductivity type, said semiconductor device being divided into two sections, a first section containing active regions in an upper region of said lightly doped layer of said first conductivity type and a second section containing no active regions, said first and second sections being completely covered by a continuous metallization layer such that said continuous metallization layer disposed above said second section is elevated with respect to said metallization layer disposed above said first section of said semiconductor device and so that said continuous metallization layer disposed above said second section is connected to at least a portion of the electrode of said active element of said first section.

13. The integrated pad assembly according to claim 12 wherein said active region is a region of semiconductor material of a second conductivity type.

14. The integrated pad assembly according to claim 13 wherein said active region comprises a heavily doped region of said second conductivity type and a lightly doped region of said second conductivity type about a periphery of said heavily doped region.

15. The integrated pad assembly according to claim 14 wherein a plurality of regions of a heavily doped semiconductor material of said first conductivity type are located within said regions of semiconductor material of said second conductivity type.

16. The integrated pad assembly according to claim 14 wherein said plurality of regions is two regions of the first conductivity type.

17. The integrated pad assembly according to claim 14 wherein at least one layer of dielectric material is disposed above at least a part of said heavily doped region of said second conductivity type.

18. The integrated pad assembly according to claim 12 wherein said second section contains at least one layer of dielectric material between said metallization layer and said layer of lightly doped semiconductor material of said first conductivity type.

19. The integrated pad assembly according to claim 12 wherein said second section contains a plurality of layers of material between said metallization layer and said layer of lightly doped semiconductor material of said first conductivity type and wherein at least one of said plurality of layers of material is a dielectric material.

20. The integrated pad assembly according to claim 19 wherein said plurality of layers includes a first layer of dielectric material, a second layer of polysilicon material and a third layer of dielectric material.

21. An integrated bonding pad assembly for wire bonding to an electrode of a power semiconductor device chip, comprising a chip portion having a top surface completely covered by a metallization layer and which comprises first sub-portions wherein functionally active elements of the power device are present and second sub-portions wherein no functionally active elements of the power device are present, said second sub-portions being disposed substantially adjacent the first sub-portions, wherein said top surface of the metallization layer of said second sub-portions is elevated with respect to said top surface of the metallization layer of said first sub-portions to form a plurality of bonding pad assemblies which form a support surface for a wire.

22. The integrated structure pad assembly according to claim 21, wherein said first sub-portions and said second sub-portions are disposed in a bidimensional array and said second sub-portions have horizontal dimensional substantially identical to horizontal dimensions of said first sub-portions.

23. The integrated structure pad assembly according to claim 22, wherein said second sub-portions are located in a square array and are surrounded by said first sub-portions.

24. The integrated structure pad assembly according to claim 23, wherein said square array is a 2 by 2 array.

25. The integrated structure pad assembly according to claim 22, wherein said second sub-portions are located in one dimensional arrays and surrounded by said first sub-portions.

26. The integrated structure pad assembly according to claim 22, wherein said semiconductor device chip includes a substrate which is located under both said first sub-portions and said second sub-portions and which is entirely covered by a lightly doped layer of a first conductivity type, wherein each one of said first sub-portions includes a respective first portion of said lightly doped layer in which a heavily doped region of a second conductivity type is disposed and in which at least one heavily doped region of the first conductivity type is further disposed within the heavily doped region of the second conductivity type, at least a part of said heavily doped region of the second conductivity type being covered by a triple layer comprising a first insulating layer, a conductive layer, and a second insulating layer, wherein each one of said second sub-portions includes a respective second portion of the lightly doped layer which is completely covered by said triple layer, and wherein the first insulating layer disposed above the second sub-portions is thicker than the respective first insulating layer disposed above said first sub-portions.

27. The integrated structure pad assembly according to claim 26, wherein said lightly doped layer of the first conductivity type is an epitaxial layer.

28. The integrated structure pad assembly according to claim 27, wherein said substrate is of the first conductivity type.

29. The integrated structure pad assembly according to claim 27, wherein said substrate is of the second conductivity type.

* * * * *